(12) United States Patent
Kang

(10) Patent No.: US 12,710,447 B2
(45) Date of Patent: Aug. 18, 2026

(54) TEST SOCKET

(71) Applicant: TSE CO., LTD., Chungcheongnam-do (KR)

(72) Inventor: Yee Sun Kang, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 198 days.

(21) Appl. No.: 18/649,777

(22) Filed: Apr. 29, 2024

(65) Prior Publication Data

US 2024/0369597 A1 Nov. 7, 2024

(30) Foreign Application Priority Data

May 3, 2023 (KR) ........................ 10-2023-0057819

(51) Int. Cl.
*G01R 1/04* (2006.01)

(52) U.S. Cl.
CPC .................................. *G01R 1/0466* (2013.01)

(58) Field of Classification Search
CPC .. G01R 1/0466; G01R 1/0416; G01R 1/0408; G01R 1/06722; G01R 1/06733; G01R 31/2863; G01R 31/2889; G01R 31/2896
USPC ....................... 324/754.03, 754.01, 537, 500
See application file for complete search history.

(56) References Cited

U.S. PATENT DOCUMENTS

| | | | | |
|---|---|---|---|---|
| 4,724,383 A * | 2/1988 | Hart | G01R 1/07378 324/750.25 |
| 6,489,791 B1 * | 12/2002 | Tsujii | G01R 1/07314 324/762.01 |
| 8,610,447 B2 * | 12/2013 | Lee | G01R 1/06722 324/756.02 |
| 12,105,138 B2 * | 10/2024 | Shin | G01R 31/2863 |
| 2007/0018666 A1 * | 1/2007 | Barabi | G01R 1/06722 324/755.05 |
| 2011/0117796 A1 * | 5/2011 | Oishi | H01R 13/2421 439/841 |
| 2021/0325453 A1 * | 10/2021 | Chan | G01R 31/2874 |
| 2025/0085309 A1 * | 3/2025 | Barabi | G01R 1/07378 |
| 2025/0306089 A1 * | 10/2025 | Ahn | G01R 31/2887 |

FOREIGN PATENT DOCUMENTS

KR 10-2022-0136686 10/2022

* cited by examiner

*Primary Examiner* — Giovanni Astacio-Oquendo

(57) ABSTRACT

The test socket according to the present disclosure is configured to allow terminals of a warped device under test to comes into contact with electrode pads of a tester, which generates a test signal, to perform an electrical test for the device under test, this test socket is configured such that, by the upper plungers, which are separate components from the barrel assembly and have different thicknesses, the terminals of the warped device under test can come simultaneously into contact with the socket pins, thereby applying the same stroke to all the socket pins.

6 Claims, 7 Drawing Sheets

< Prior Art >

< Prior Art >

< Prior Art >

(a)

(b)

(a)

(b)

(a)

(b)

TEST SOCKET

CROSS-REFERENCE TO RELATED APPLICATION

This application claims priority of Korean Patent Application No. 10-2023-0057819, filed on May 3, 2023, in the KIPO (Korean Intellectual Property Office), the disclosure of which is incorporated herein entirely by reference.

BACKGROUND OF THE INVENTION

Field of the Invention

The present disclosure relates to a test socket, and more specifically, to a test socket used for electrical testing a warped device under test.

Description of the Related Art

A device under test (for example, a semiconductor package) is formed by integrating fine electronic circuits with high density, and during a manufacturing process, is subjected to a test process for determining whether each electronic circuit is normal. The test process is a process for testing the device under test to determine whether the device under test is normally operated, and, as a result, distinguishing defect-free products from defective products.

In the process of testing the device under test, a tester configured to electrically connect a terminal of a device under test and a test board applying a test signal is employed. The tester has various structures depending on the type of devices under test, which is subject of testing. The tester and the device under test are not directly connected to each other, but are indirectly connected to each other via a test socket.

In the case of, among the conventional semiconductor packages, a ball grid array (BGA) package that uses solder balls as connection terminals, a test socket has a structure in which a socket pin is embedded in a socket barrel, and is fabricated using molding and mechanical machining. As the socket pin, a pogo pin having its own elasticity has been mainly used.

As shown in FIG. 1, a conventional pogo pin 30 has a structure in which an upper pin 32 coming into contact with a device under test and a lower pin 33 coming into contact with a tester are disposed at upper and lower portions of a barrel 31, respectively and a spring 34 is interposed between the upper pin and the lower pin.

The pogo pin 30 is assembled by caulking a top 35 and bottom 36 of the cylindrical barrel to prevent the upper pin 32 and the lower pin 33 from being separated from the barrel 31. In the pogo pin 30, an electrical connection is preferably formed among the upper pin, the lower pin and the barrel, so the pogo pin may be made of a conductive material, such as a copper alloy coated with gold, or the like.

As shown in FIGS. 2 and 3, a test socket 100 is formed by disposing each pogo pin 30 in holes, which are formed in a plate 120 and a housing 110, respectively. In the test socket, the upper pin 32 of the pogo pin 30 is placed to be electrically connected to a terminal of a device under test, and the lower pin 33 is placed to be electrically connected to an electrode pad of a tester, so an electrical test for the device under test can be performed.

In recent, in response to the demand for miniaturization and slimming of electronic products, efforts are continuing to make semiconductor packages, which are used as essential components in various electronic products, smaller and thinner, and the degree of integration of semiconductor packages continues to be increased for high performance and multifunctionality of electronic products.

However, during a manufacturing process of such a complex and thin semiconductor package, due to a difference in thermal expansion coefficient between elements, a bending deformation of the semiconductor package, a so-called warpage phenomenon, may occur, causing the semiconductor package to be manufactured in non-flat plate shape.

Due to the above, a semiconductor package, that is, a device 10 under test has a slight warping deformation in which a periphery is warped upward relative to a central portion as shown in (a) of FIG. 3, or in which a periphery is warped downward relative to a central portion as shown in (b) of FIG. 3. It should be noted that, in the present disclosure, as compared to the device 10 under test in the form of a flat plate without any warpage, a device under test whose periphery is warped upward relative to a central portion and a device under test whose periphery is warped downward relative to a central portion may be distinguished from each other and described as a device 10A under test and a device 10B under test, respectively, and that both devices of under test may be described as the device 10 under test without distinction.

Although the above warpage generated on the device 10 under test is so fine that it may be difficult to check this warpage with naked eye, but during test, due to a difference in a distance between the housing 110 of the test socket 100 and the terminal 11 of the device under test, the amount of contact between the pogo pin 30 and the terminal is not uniform for all terminals according to a shape of the warpage. As a result, an over stroke or contact failure may occur. In other words, the terminals 11 excessively compress the pogo pins 30 disposed on the central portion of the test socket in (a) of FIG. 3 and on the periphery of the test socket in (b) of FIG. 3, whereas the terminals 11 may not properly come into contact with the pogo pins 30 disposed on the periphery of the test socket in (a) of FIG. 3 and on the central portion of the test socket in (b) of FIG. 3. Due to the above, unstable contact may occur between the terminal 11 of the device under test and the pogo pin 30 of the test socket, thereby reducing the test accuracy on the device 10 under test.

In addition, when the warped device 10A or 10B under test is tested using the test socket 100 in which the plurality of pogo pins 30 having the same length are disposed, the test is performed in a state where the amount of contact between the terminal and the pogo pin is not constant for all terminals. Therefore, the pogo pins 30 which are excessively compressed can be easily damaged, thereby shortening the lifespan of the test socket, and the terminal 11 of the device under test may also be excessively compressed and damaged by the pogo pin 30, which leads to a problem of reducing the test reliability for the device under test.

The above-described information disclosed in the background description is provided only for improving the understanding of the background of the present disclosure, and thus may include the information which does not constitute the prior art.

SUMMARY OF THE INVENTION

The present disclosure is devised to solve the above-mentioned problems, and an object of the present disclosure is to provide a test socket which can come stably into contact with terminals of a warped device under test, can increase its own life span, and can secure stable signal transmission characteristic.

In order to achieve the above-mentioned objects, a test socket according to the present disclosure is configured to allow terminals of a warped device under test to comes into contact with electrode pads of a tester, which generates a test signal, to perform an electrical test for the device under test, the test socket may include a plurality of socket pins, each socket pin comprising a barrel assembly in which a lower plunger, which can come into contact with the electrode pad, is supported by an elastic force, a first contact part composed as a separate element from the barrel assembly and being capable of coming into contact with the terminal, and an upper plunger provided with a second contact part coming into contact with the barrel assembly; and a socket body having pin holes in which the socket pins are disposed respectively, each pin hole being formed at a position corresponding to the terminal of the device under test, wherein the upper plunger of at least one of the plurality of socket pins has a thickness different from thicknesses of the upper plungers of other socket pins.

The upper plunger having a thickness corresponding to a distance between the terminal and the socket body may be disposed in each of the plurality of socket pins to allow all the upper plungers to simultaneously come into contact with the corresponding terminals.

A thickness of the upper plunger of the socket pin disposed on a periphery of the socket body may be smaller than a thickness of the upper plunger of the socket pin disposed on a central portion.

A thickness of the upper plunger may be increased from the upper plunger of the socket pin disposed on a periphery of the socket body towards the upper plunger of the socket pin disposed on a central portion.

A thickness of the upper plunger of the socket pin disposed on a periphery of the socket body may be greater than a thickness of the upper plunger of the socket pin disposed on a central portion.

A thickness of the upper plunger may be decreased from the upper plunger of the socket pin disposed on a periphery of the socket body towards the upper plunger of the socket pin disposed on a central portion.

The socket body may include a housing having housing holes formed therein, each housing hole being configured to receive a portion of the upper plunger therein; and a plate coupled to a lower side of the housing and having plate holes formed therein, each housing hole being configured to receive a portion of the barrel assembly therein, wherein the housing hole and the plate hole may be combined with each other to form a pin hole.

In the above-described test socket according to the present disclosure, the upper plungers, which are separate components from the barrel assembly, are provided in the socket pins, respectively and have different thicknesses depending on the amount of warpage of the device under test, are disposed to enable the same amount of stroke to be delivered to all the socket pins. Thus, the test socket can come stably into contact with the terminals of the warped device under.

In addition, in the test socket according to the present disclosure, the same amount of stroke is delivered to all socket pins, so the problem of the socket pins being deformed or damaged due to an over-stroke acting on the socket pins by the warped device under test can be reduced or eliminated. Accordingly, product lifespan can be increased and damage to the terminal of the device under test can be prevented.

Furthermore, in the test socket according to the present disclosure, since the recommended stroke is delivered to all socket pins, stable signal transmission is possible without occurring contact failure or over-stroke between the socket pin and the terminal of the device under test, and test efficiency can thus be enhanced.

Also, the test socket according to the present disclosure can be configured to test the warped device under test by simply assembling the upper plungers with different thicknesses depending on the amount of warpage of the device under test. Therefore, the present disclosure can easily prepare the test socket, which can cope with the warped device under test, in a short time.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

In the following description, the same or similar elements are labeled with the same or similar reference numbers.

DETAILED DESCRIPTION

Figure 1:
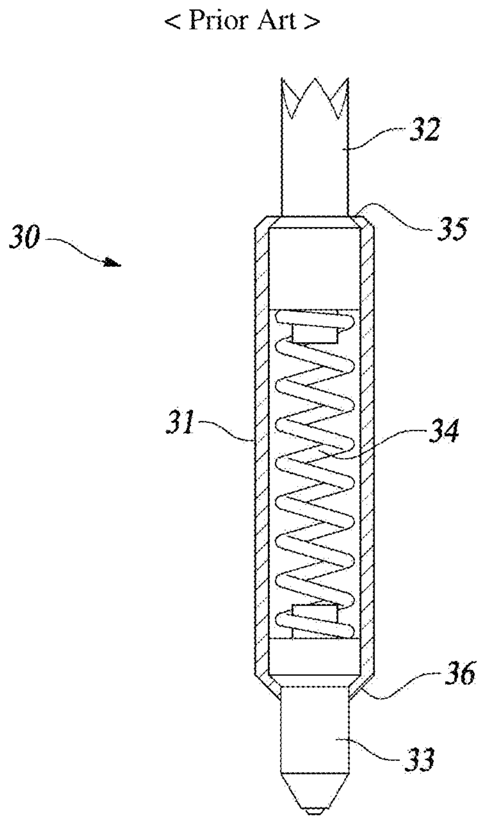
FIG. 1 is a view showing a pogo pin used in a conventional test socket.
Figure 2:
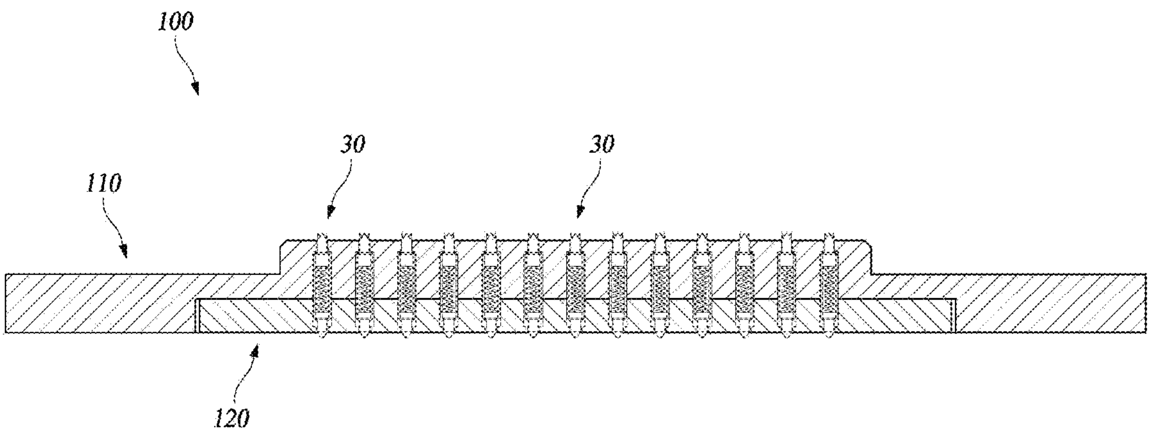
FIG. 2 is a cross-sectional view showing a test socket equipped with a conventional pogo pin.
Figure 3:
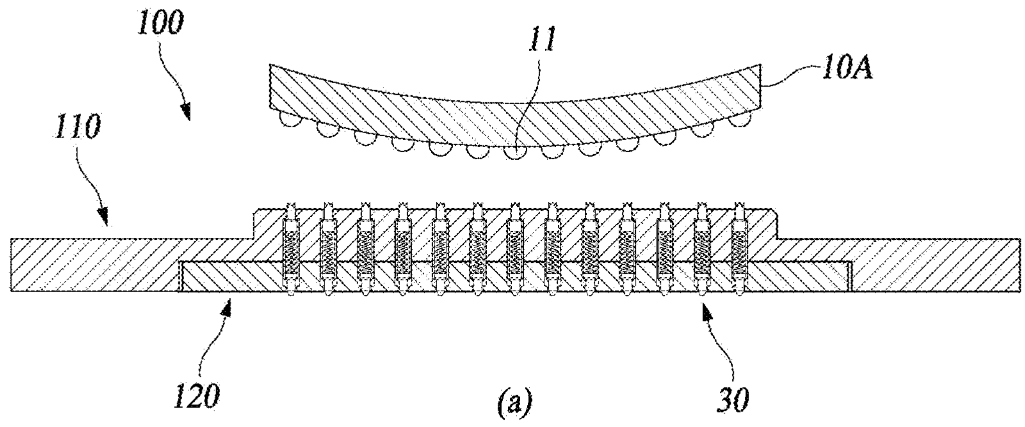
FIG. 3 is a view showing that the conventional test socket and a warped device under test come into contact with each other.
Figure 3:
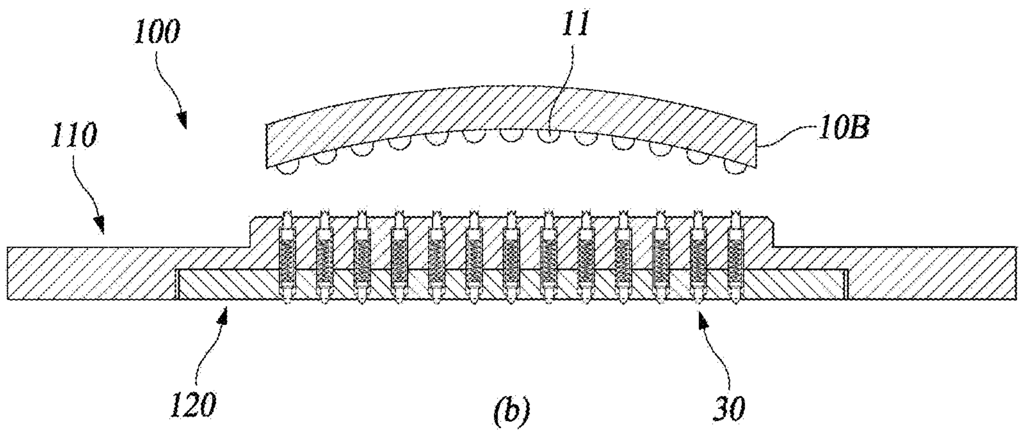

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms “a”, “an” and “the” are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 4:
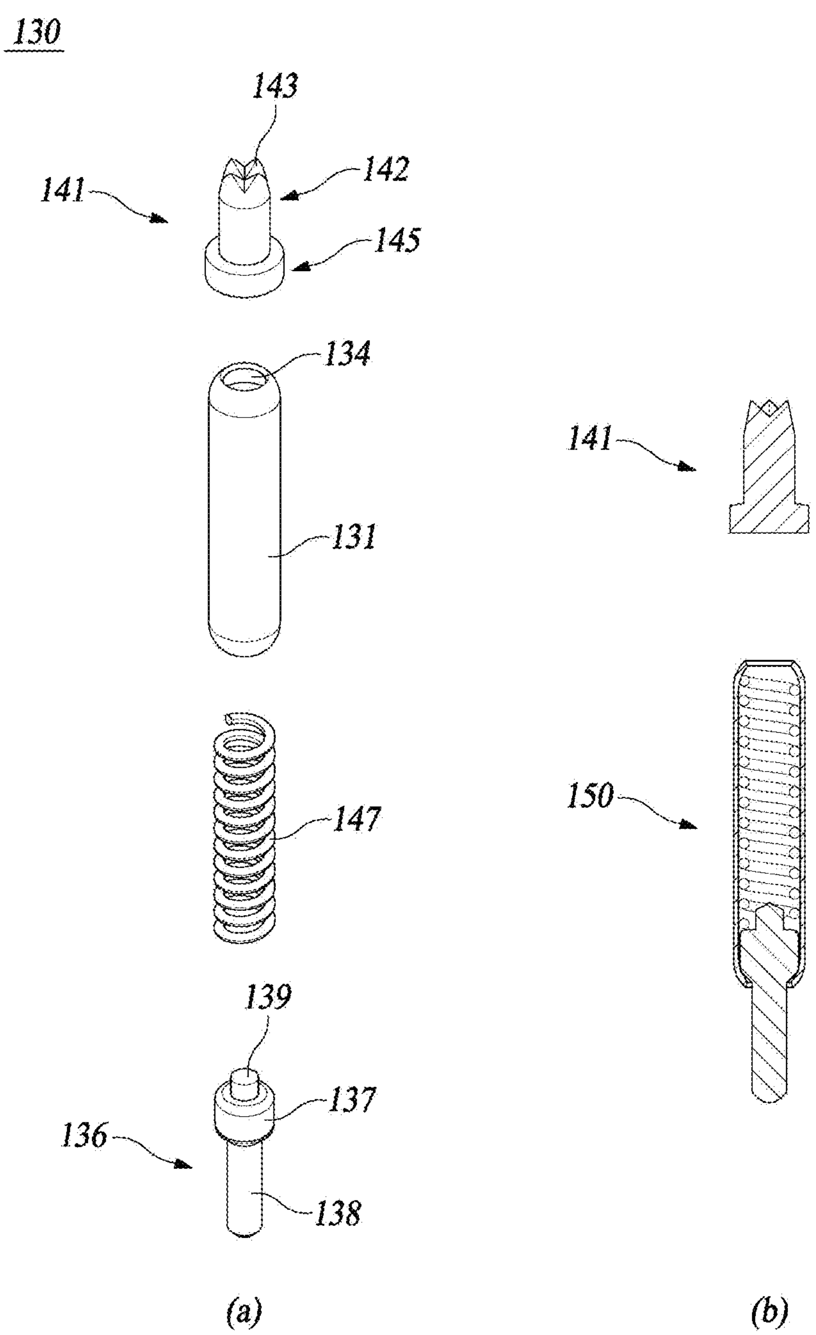
FIG. 4 is an exploded perspective view showing a socket pin for a test socket according to one an embodiment of the present disclosure.
Figure 5:
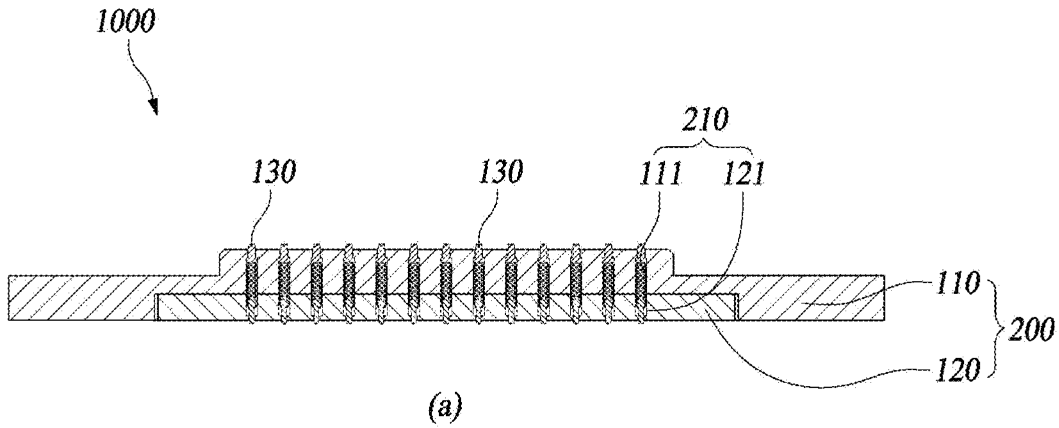
FIG. 5 is a cross-sectional view showing the test socket, according to one embodiment of the present disclosure, equipped with socket pins.
Figure 5:
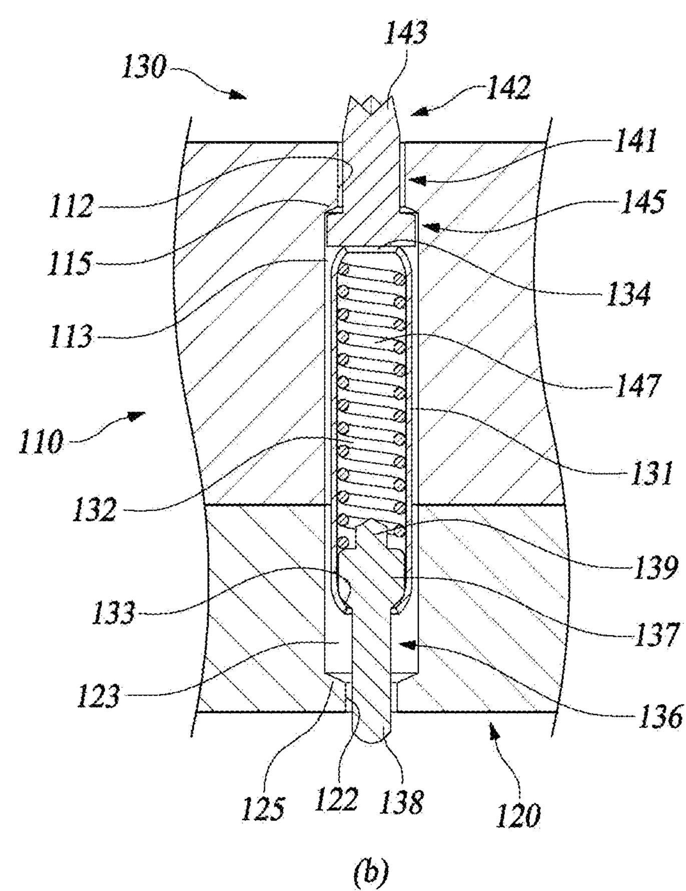
Figure 6:
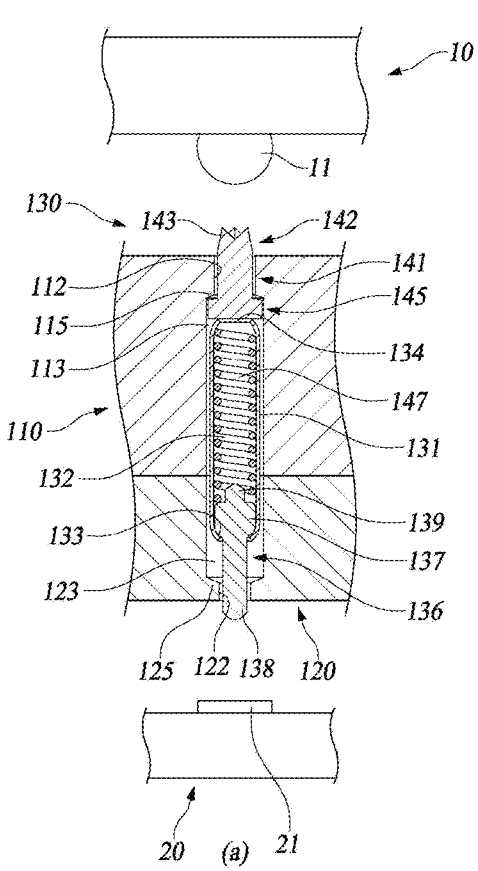
FIG. 6 is a view for describing a method of testing a device under test using the test socket according to one embodiment of the present disclosure.
Figure 6:
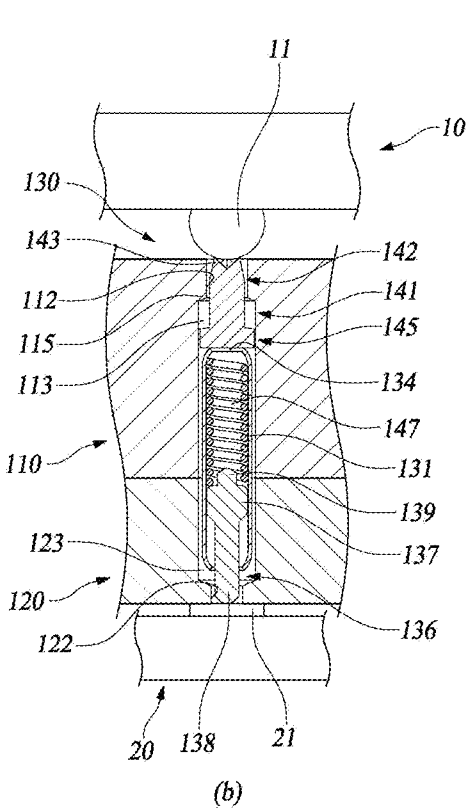
Figure 7:
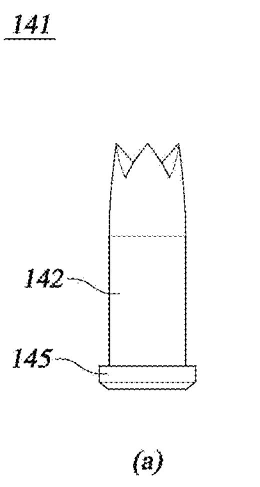
FIG. 7 is views showing upper plungers having different thicknesses.
Figure 7:
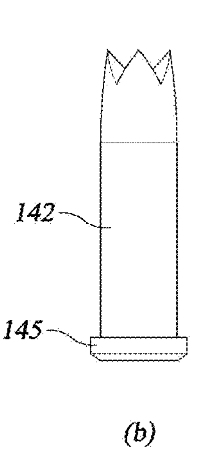
Figure 7:
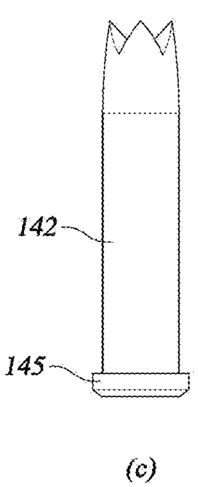
Figure 8:
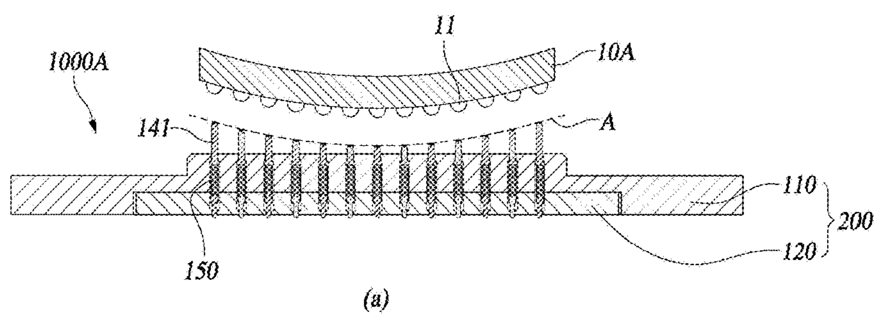
FIG. 8 is a view showing a state in which the test socket according to one embodiment of the present disclosure and a warped device under test, whose periphery is warped upward, come into contact with each other.
Figure 8:
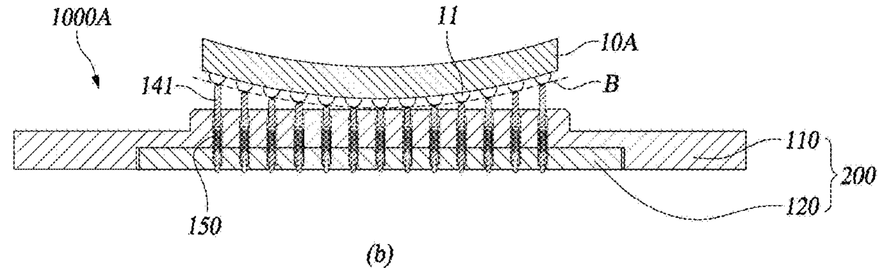
Figure 9:
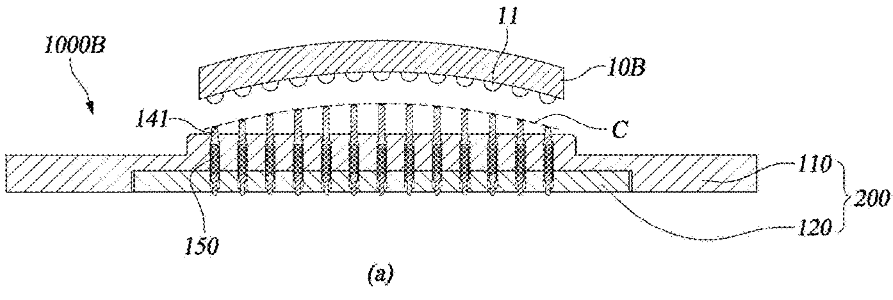
FIG. 9 is a view showing a state in which the test socket according to one embodiment of the present disclosure and the warped device under test, whose periphery is warped downward, come into contact with each other.
Figure 9:
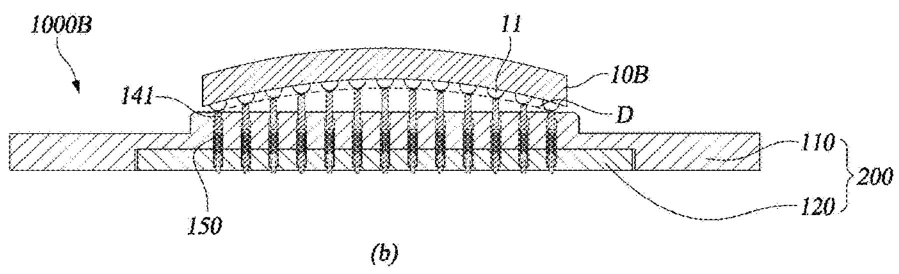
Figure 10:
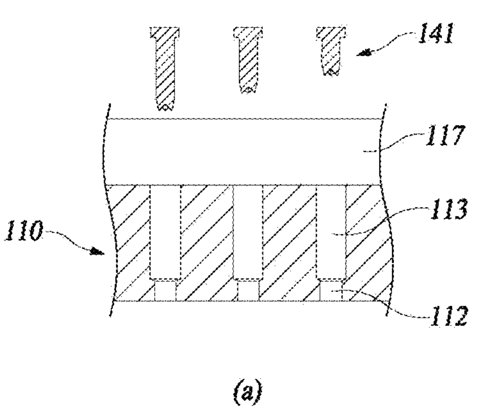
FIG. 10 is views showing a process for assembling the test socket according to one embodiment of the present disclosure.
Figure 10:
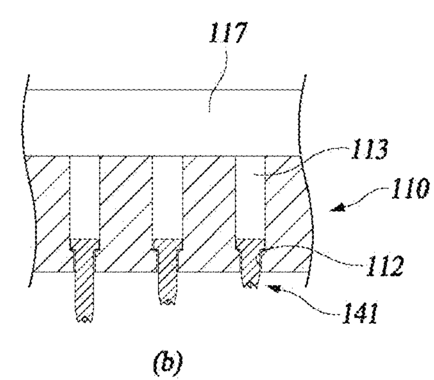
Figure 10:
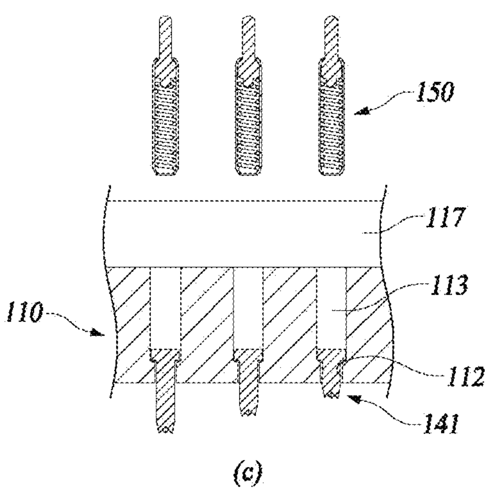
Figure 10:
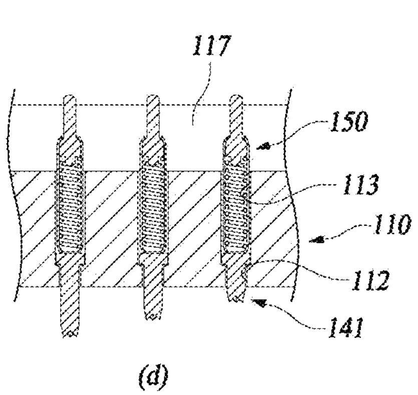
Figure 10:
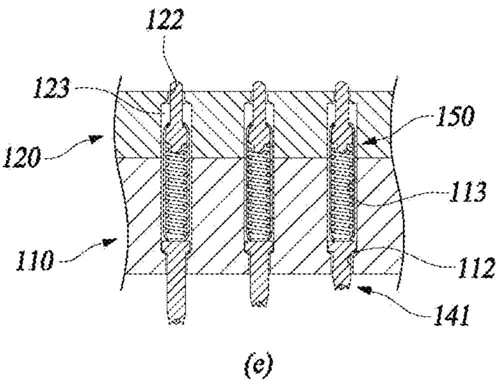

FIG. 4 is an exploded perspective view showing a socket pin for a test socket according to one an embodiment of the present disclosure, FIG. 5 is a cross-sectional view showing the test socket, according to one embodiment of the present disclosure, equipped with socket pins, FIG. 6 is a view for describing a method of testing a device under test using the test socket according to one embodiment of the present disclosure, FIG. 7 is views showing upper plungers having different thicknesses, FIG. 8 is a view showing a state in which the test socket according to one embodiment of the present disclosure and the warped device under test, whose periphery is warped upward, comes into contact with each other, FIG. 9 is a view showing a state in which the test socket according to one embodiment of the present disclosure and the warped device under test, whose periphery is warped downward, comes into contact with each other, and FIG. 10 is a view showing a process for assembling the test socket according to one embodiment of the present disclosure.

As shown in the drawings, a test socket 1000 according to one embodiment of the present disclosure is provided to connect terminals 11 of a warped device 10 under test to electrode pads 21 of a tester 20 generating a test signal, thereby performing an electrical test for the device 10 under test. The test socket 1000 includes a socket body 200 and a plurality of socket pins 130 disposed and supported in pin holes 210, respectively, of the socket body 200.

The socket body 200 includes a housing 110 having housing holes 111 formed therein, and a plate 120 having plate holes 121 formed therein, the plate holes corresponding to the housing holes 111, respectively. The housing 110 and the plate 120 are coupled with each other by a screw coupling manner or various other manner to form the socket body 200, and the housing hole 111 and the plate hole 121 are combined to form the pin hole 210 in which the socket pin 130 is placed.

The housing 110 is a part to which a portion of each socket pin 130 is mounted, and supports the plurality of socket pins 130 together with the plate 120. A plurality of housing holes 111 into which the socket pins 130 are inserted, respectively, are formed in the housing 110. Each housing hole 111 is formed to pass through the housing 110 in a vertical direction, that is, in a thickness direction. Each of the housing holes 111 includes an outer housing hole 112 extending from one side of the housing 110 to the inside of the housing 110, and an inner housing hole 113 being in communication with the outer housing hole 112 and extending to the other side of the housing 110. Here, one side of the housing 110 is a side facing the device 10 under test. A width of the outer housing hole 112 is smaller than that of the inner housing hole 113. A housing latching protrusion 115 is formed on a boundary between the outer housing hole 112 and the inner housing hole 113, so a portion of the socket pin 130 comes into contact with this housing latching protrusion to prevent the socket pin 130 from being escaped from the housing hole 111.

The plate 120 is coupled to a lower side of the housing 110 to supports the plurality of socket pins 130. The plate 120 has the plurality of plate holes 121 corresponding to the plurality of housing holes 111, respectively. The plate hole 121 is formed to pass through the plate 120 in a thickness direction. The plate hole 121 includes an outer plate hole 122 extending from one side of the plate 10 to the inside of the plate 120, and an inner plate hole 123 being in communication with the outer plate hole 122 and extending to the other side of the plate 120. Here, the other side of the plate 120 is a side facing the housing 110. A width of the outer plate hole 122 is smaller than that of the inner plate hole 123. The inner plate hole 123 may be designed to have the same width as that of the inner housing hole 113. A plate latching protrusion 125 is formed on a boundary between the outer plate hole 122 and the inner plate hole 123, so that a portion of the socket pin 130 comes into contact with this plate latching protrusion to prevent the socket pin 130 from being escaped from the plate hole 121.

In addition to the structure shown in the drawings, the housing 110 and the plate 120, which form the socket body 200, may be coupled with each other to be modified into various other structures capable of supporting the plurality of socket pins 130.

As shown in FIG. 4, the socket pin 130 may be supported by the housing 110 and the plate 120 to electrically connect the device 10 under test and the tester 20. The socket pin 130 includes a barrel 131, a lower plunger 136 received inside the barrel 131, an upper plunger 141 disposed outside the barrel 131, and a spring 147 disposed inside the barrel 131.

The barrel 131 may be formed to have a tube shape within which a space 132 is formed. The lower plunger 136 and the spring 147 are received in the space of the barrel 131. A barrel hole 133 is formed in one end of the barrel 131, and an opening 134 is provided in the other end of the barrel 131. A width of the barrel hole 133 is smaller than that of the space 132.

In the lower plunger 136, an upper side is received inside the barrel 131 to come into contact with the spring 147 and a lower side may protrude from a lower end of the barrel 131 through the barrel hole 133 to come into contact with the electrode pad 21 of the tester 20.

The lower plunger 136 may include a head part 137, an extension part 138 extending from one end portion of the head part 137 so as to enable it to pass through the barrel hole 133, and a protrusion part 139 extending from the other end portion of head part 137. However, the specific structure of the lower plunger 136 is not limited to that shown in the drawings, and may be variously modified. A width of the head part 137 is greater than that of barrel hole 133 and a width of the extension part 138 is smaller than that of the barrel hole 133, so that the extension part 138 protrudes from one end of the barrel 131 to enable an end thereof to come into contact with the electrode pad 21 of the tester 20.

The spring 147 may be received inside the barrel 131 to apply an elastic force to the lower plunger 136 and the upper plunger 141. One end of the spring 147 comes into contact with the lower plunger 136 and the other end comes into contact with an inner surface of the barrel 131. Accordingly, the lower plunger 136 comes into direct contact with the spring 147, so it can directly receive the elastic force of the spring 147, whereas since the upper plunger 141 does not come into contact the spring 147, it may indirectly receive the elastic force of the spring 147 through the barrel 131.

The spring 147 and the lower plunger 136 are coupled with the barrel 131 to form a barrel assembly 150. Accordingly, the barrel assembly 150 supports the lower plunger 136 using an elastic force. This elastic barrel assembly 150 may be provided as a single piece.

The upper plunger 141 is configured as a separate element from the barrel assembly 150. That is, the upper plunger 141 may be provided as a distinct member separated from the barrel assembly 150. The upper plunger 141 comes into contact with an upper end of the barrel assembly 150 at the outside of the barrel assembly 150 so that it may come into contact with the terminal of the device 10 under test.

The upper plunger 141 includes a first contact part 142 capable of coming into contact with the terminal 11 of the device 10 under test, and a second contact part 145 that comes into contact with an upper surface of the barrel assembly 150. A width of the second contact part 145 is greater than that of the first contact part 142. The first contact part 42 protrudes from a central portion of one surface of the second contact part 145. The first contact part 142 has a width smaller than that of the outer housing hole 112 of the housing 110, and thus may pass through the outer housing hole 112. However, the second contact part 145 has a width greater than that of the outer housing hole 112 of the housing 110, and thus cannot pass through the outer housing hole 112. Therefore, although the upper plunger 141 is movable within the housing hole 111, the second contact part 145 is caught on the housing latching protrusion 115 of the housing 110, whereby the upper plunger cannot be disengaged from the housing 110 through the outer housing hole 112.

The first contact part 142 may be provided with a plurality of tip portions 143 formed on a top thereof to allow it to stably come into contact with the ball-shaped terminal 11 of the device 10 under test. A lower surface of the second contact part 145 comes into contact with the upper surface of the barrel assembly 150 at the outside of the barrel assembly 150 to be electrically connected to the barrel assembly 150.

The barrel 131, the lower plunger 136, and the upper plunger 141 may be made of a copper alloy, which is coated with gold, or another conductive material such that they can transmit an electrical signal.

As shown in FIG. 5, the socket pin 130 is coupled with the housing 110 and the plate 120 such that a portion of the lower plunger 136 protrudes from the plate 120 and a portion of the upper plunger 141 protrudes from the housing 110.

One portion of the barrel 131 of the socket pin 130 is placed within the inner housing hole 113 of the housing 110 and the other portion is disposed within the inner plate hole 123 of the plate 120, whereby the barrel may be moved within the inner housing hole 113 and inner plate hole 123 in a longitudinal direction thereof. The extension part 138 of the lower plunger 136, which protrudes from one end of the barrel 131, passes through the inner plate hole 123 and the outer plate hole 122, and then protrudes outside the plate 120. An end of the extension part 138 of the lower plunger 136, which protrudes outside the plate 120, may come into contact with the electrode pad 21 of the tester 20. In the upper plunger 141, the second contact part 145 is disposed within the inner housing hole 113 of the housing 110, and the first contact part 142 passes through the outer housing hole 112 and then protrudes from the housing 110. In a state of coming into contact with the barrel 131 within the housing hole 11, the second contact part 145 may be moved together with the barrel 131. The first contact part 142 of the upper plunger 141, protruding from the housing 110, may come into contact with the terminal 11 of the device 10 under test.

The test socket 1000 is installed on the tester 20 so that the plurality of lower plungers 136 come into contact with the electrode pads 21 provided in the tester 20. As shown in FIG. 6, a test for the device 10 under test in the form of an un-warped flat plate may be performed using the socket pin 130 having a certain length.

In the process of an electrical test for the device 10 under test in the form of an un-warped flat plate, the device 10 under test approaches the test socket as much as a recommended stroke, and the terminals 11 of the device 10 under test comes into contact with the first contact parts 142 of the upper plungers 141, respectively. Since the terminals 11 of the device 10 under test have the same constant height, the terminals may pressurize the first contact parts 142 such that they push the first contact parts downward by a height corresponding to the recommended stroke.

When the terminal 11 of the device 10 under test comes into close contact with the upper plunger 141, a pressure applied to the upper plunger 141 is transmitted to the barrel 131 and the lower plunger 136, thereby compressing the spring 147. In addition, in a state where the lower plunger 136 is in stationary, the upper plunger 141 and the barrel 131 are pushed towards the tester 20. Due to the elastic force of the spring 147, at this time, a stable contact state between the lower plunger 136 and the electrode pad 21 of the tester 20 is maintained, and a stable contact state between the first contact part 142 of the upper plunger 141 and the terminal 11 may be maintained. Therefore, the terminal 11 of the device 10 under test is electrically connected to the electrode pad 21 of the tester 20 through the upper plunger 141, the barrel 131, and the lower plunger 136 of the socket pin 130. At this time, the test signal generated from the tester 20 is transmitted to the device 10 under test through the socket pin 130, so that an electrical test for the device 10 under test can be performed.

The device under test may be warped device. An optical method is mainly used to inspect the degree of warpage of the device under test. For example, the warpage may be measured by irradiating a surface of a warped object to be measured with a ray using a light source such as an infrared ray source, and then detecting the reflected ray.

As such, in the warped device 10A or 10B, the terminals 11 which will come into close contact with the upper plungers 141 of the test socket have a difference in distance between the terminal 11 and the housing 110 of the test socket 1000*a*, so the degrees of close contact, that is, the contact strokes for all terminals are not consistent with each other.

As shown in FIGS. 7 to 9, in the test socket 1000 according to one embodiment of the present disclosure, the socket pins 130 provided with the upper plungers 141 disposed therein and having thicknesses corresponding to a difference in distance of the terminals (depending on the degree of warpage of the device under test) are employed to enable a stable test for the warped device 10 under test to be performed. The test socket 1000 of the present disclosure is divided into a test socket 1000A for testing the device 10A under test whose periphery is warped upward relative to a central portion and a test socket 1000B for testing the device 10B under test whose periphery is warped downward relative to a central portion, and is described, but it may be described without distinction.

The upper plungers 141 may be formed to have various lengths by making the second contact parts 145 have the same in width and thickness, and the first contact parts 142 have the same width, but different thicknesses. FIG. 7 exemplarily shows the plurality upper plungers 141, where a thickness of any plunger 141 is smaller than that of the plunger placed to its right.

FIG. 8 shows a state in which the device under test, whose periphery is warped upward relative to a central portion, comes into contact with the test socket.

As shown in (a) of FIG. 8, for the warped device 10A under test whose periphery is warped upward relative to the central portion, by using the test socket 1000A having the socket pins 130 disposed therein, in which the upper plungers 141 have different thickness such that a distance between each terminal of the device under test and an upper end of the corresponding upper plunger of the socket pin is constant, the plurality of socket pins 130 may simultaneously and stably come into contact with the corresponding terminals 11 of the device 10A under test to perform the test. The socket pins 130 of the test socket 1000A have different thicknesses, that compensate for a difference of distance between the terminal 11 of the device 10A under test and the housing 110 of the socket body 200, to correspond to a distance between the terminal and the housing. In (a) of FIG. 8, the reference numeral "A" refers to a virtual surface representing a curved surface connecting the upper ends of the upper plungers, each of which having a thickness corresponding to a distance between the terminal of the device under test and the housing of the socket body.

In the test socket 1000A for corresponding to a distance between the socket body 200 and the terminal of the device 10A under test whose periphery is warped upward relative to the central portion, by placing the upper plunger 141 with a large thickness in the socket pin 130 disposed on the periphery of the socket body 200 and the upper plunger 141 with a small thickness in the socket pin 130 disposed on the central portion of the socket body 200, or by placing the socket pins 130 such that a thickness of the upper plunger 141 of the socket pin 130 is decreased from the upper plunger of the socket pin 130 disposed on the periphery of the socket body 300 towards the upper plunger of the socket pin 130 disposed on the central portion, the socket pins 130 may come simultaneously into contact with the corresponding terminals 11 of the device 10A under test.

Therefore, as shown in (b) of FIG. 8, in the process of the electrical test for the warped device 10A under test whose periphery is warped upward relative to the central portion, when the device under test approaches the test socket, the terminals 11 of the device 10A under test and the socket pins 130 come simultaneously into contact with each other since each socket pin 130 has a thicknesses which compensates for a difference in distance between the terminals 11 of the device under test. That is, the terminals 11 of the device 10A under test come simultaneously into contact with the upper ends, which are positioned on the virtual surface A, of the corresponding socket pins.

Then, when the device under test is pressurized with a stroke corresponding to the recommended stroke, a pressing force is transmitted to the socket pins, and each socket pin is compressed to a position of B. A moving distance of the socket pin is the recommended stroke, which corresponds to a distance between A and B. In this state, the test signal from the tester is transmitted to the device under test, and an electrical test is performed for the device under test.

FIG. 9 shows a state in which the device under test, whose periphery is warped downward relative to a central portion, comes into contact with the test socket. The operation of the above configuration is similar to that described with reference to FIG. 8.

As shown in (a) of FIG. 9, for the warped device 10B under test whose periphery is warped downward relative to the central portion, by using the test socket 1000B having the socket pins 130 disposed therein, in which the upper plungers 141 have different thickness such that a distance between each terminal of the device under test and an upper end of the corresponding upper plunger of the socket pin is constant, the plurality of socket pins 130 may simultaneously and stably come into contact with the corresponding terminals 11 of the device 10A under test to perform the test. In (a) of FIG. 9, the reference numeral "C" refers to a virtual surface representing a curved surface connecting the upper ends of the upper plungers, each of which having a thickness corresponding to a distance between the terminal of the device under test and the housing of the socket body.

In the test socket 1000B for corresponding to a distance between the socket body 200 and the terminal of the device 10B under test whose periphery is warped downward relative to the central portion, by placing the upper plunger 141 with a small thickness in the socket pin 130 disposed on the periphery of the socket body 200 and the upper plunger 141 with a large thickness in the socket pin 130 disposed on the central portion of the socket body 200, or by placing the socket pins 130 such that a thickness of the upper plunger 141 of the socket pin 130 is increased from the upper plunger of the socket pin 130 disposed on the periphery of the socket body 300 towards the upper plunger of the socket pin 130 disposed at the central portion, the socket pins 130 may come simultaneously into contact with the corresponding terminals 11 of the device 10B under test.

Therefore, as shown in (b) of FIG. 9, like the test device 10A under test whose periphery is warped upward relative to the central portion, in the process of the electrical test for the warped device 10B under test whose periphery is warped downward relative to the central portion, when the device under test approaches the test socket, the terminals 11 of the device 10B under test and the socket pins 130 come simultaneously into contact with each other since each socket pin 130 has a thicknesses which compensates for a height difference between the terminals 11 of the device under test. That is, the terminals 11 of the device 10B under test come simultaneously into contact with the upper ends, which are positioned on the virtual surface C, of the corresponding socket pins.

Then, when the device under test is pressurized with a stroke corresponding to the recommended stroke, a pressing force is transmitted to the socket pins, and each socket pin is compressed to a position of D. A moving distance of the socket pin is the recommended stroke, which corresponds to a distance between C and D. In this state, the test signal from the tester is transmitted to the device under test, and an electrical test is performed for the device under test.

Although the embodiment applied to the device under test which is warped with a constant curvature is exemplarily described as an example in FIGS. 8 and 9, it goes without saying that the present disclosure is also applicable to devices under test having various curvatures. In other words, by measuring the warpage of the device under test, disposing the upper plungers with thicknesses that compensate for a distance difference between each terminal of the device under test and the housing, and causing the terminals of the device under test to compress the socket pins of the test socket with the same amount of stroke, the test can be stably performed.

As described above, in the test socket 1000 according to one embodiment of the present disclosure, the upper plungers, which are separate components from the barrel assembly, are provided in the socket pins, respectively, and have different thicknesses depending on the amount of warpage of the device under test, are disposed to enable the same amount of stroke to be delivered to all the socket pins. Thus, the test socket can come stably into contact with to the terminals of the warped device under.

In addition, in the test socket 1000 according to one embodiment of the present disclosure, the same amount of stroke is delivered to all socket pins, so the problem of the socket pins being deformed or damaged due to over-stroke acting on the socket pins by the warped device under test can be reduced or eliminated. Accordingly, product lifespan can be increased and damage to the terminal of the device under test can be prevented.

Furthermore, in the test socket 1000 according to an embodiment of the present disclosure, since the recommended stroke is delivered to all socket pins, stable signal transmission is possible without occurring contact failure or over-stroke between the socket pin and the terminal of the device under test, and test efficiency can thus be enhanced.

In addition, the test socket 1000 according to one embodiment of the present disclosure may be assembled by the same method as illustrated in FIG. 10. FIG. 10 is a view showing a left peripheral portion of the test socket 1000A for testing the device 10A under test whose periphery warped upward relative to the central portion. When the test socket 1000A is assembled, the barrel assembly 150 consisting of the barrel 131, the lower plunger 136, and the spring 147 is provided as a single piece, and the upper plunger 141 may be provided as a separate entity.

First, as shown in (a) and (b) of FIG. 10, the upper plungers 141 are coupled to the housing 110, wherein the upper plunger with a large thickness is disposed in the left housing hole corresponding to the terminal with a large distance from the housing, and on right side thereof, the upper plungers whose thicknesses are decreased towards the right side is disposed. At this time, the second contact part 145 of each of the upper plungers 141 is placed within the inner housing hole 113 of the housing 110, and the first contact part 142 passes through the outer housing hole 112.

Then, as shown in (c) and (d) of FIG. 10, the barrel assembly 150 is assembled to the housing 110 in which the upper plunger 141 is installed. At this time, the barrel assembly 150 is inserted into the inner housing hole 113 so that an upper end of the barrel assembly 150 comes into contact with the second contact part 145 of the upper plunger 141.

Next, as shown in (e) of FIG. 10, the plate 120 is coupled to the housing 110. At this time, in a state where the extension part 138 of the lower plunger 136 is inserted into the outer plate hole 122 of the plate 120, the plate 120 is coupled to the housing 110. The housing 110 and the plate 120 are secured to each other in various ways, such as a screw coupling method, or the like, so assembly of the test socket that can test the warped device under test is finished.

Therefore, the test socket 1000 according to one embodiment of the present disclosure can be configured to test the warped device under test by simply assembling the upper plungers with different thicknesses depending on the amount of warpage of the device under test. Therefore, the present disclosure can easily prepare the test socket, which can cope with the warped device under test, in a short time.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims. The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A test socket configured to allow terminals varying in height of a warped device under test to come into contact with electrode pads of a tester, which generates a test signal, to perform an electrical test for the device under test, the test socket comprising:

- a plurality of socket pins, each socket pin comprising a barrel assembly in which a lower plunger, which can come into contact with the electrode pad, is supported by an elastic force, a first contact part as a separate component distinct from the barrel assembly and being capable of coming into contact with a terminal of the terminals, and an upper plunger provided with a second contact part coming into contact with the barrel assembly,
- wherein the barrel assembly is formed by coupling the lower plunger and the spring to the barrel; and
- a socket body having pin holes in which the socket pins are disposed respectively, each pin hole being formed at a position corresponding to the terminal of the terminals of the device under test;
- wherein each socket pin includes an upper plunger having a thickness configured to compensate for a height difference of a corresponding terminal,
- wherein the upper plunger of at least one of the plurality of socket pins has a thickness different from thicknesses of the upper plungers of other socket pins, wherein when the device under test approaches the test socket, the terminals of the device under test are capable of simultaneously contacting the pins of the test socket.

2. The test socket of claim 1, wherein a thickness of the upper plunger of the socket pin disposed on a periphery of the socket body is smaller than a thickness of the upper plunger of the socket pin disposed on a central portion.

3. The test socket of claim 1, wherein a thickness of the upper plunger is increased from the upper plunger of the socket pin disposed on a periphery of the socket body towards the upper plunger of the socket pin disposed on a central portion.

4. The test socket of claim 1, wherein a thickness of the upper plunger of the socket pin disposed on a periphery of the socket body is greater than a thickness of the upper plunger of the socket pin disposed on a central portion.

5. The test socket of claim 1, wherein a thickness of the upper plunger is decreased from the upper plunger of the socket pin disposed on a periphery of the socket body towards the upper plunger of the socket pin disposed on a central portion.

6. The test socket of claim 1, wherein the socket body comprises:

a housing having housing holes formed therein, each housing hole being configured to receive a portion of the upper plunger therein; and a plate coupled to a lower side of the housing and having plate holes formed therein, each housing hole being configured to receive a portion of the barrel assembly therein, wherein the housing hole and the plate hole are combined with each other to form a pin hole.

* * * * *